United States Patent
Watabe et al.

(10) Patent No.: US 12,037,683 B2
(45) Date of Patent: Jul. 16, 2024

(54) FILM FORMING METHOD

(71) Applicant: SHIN-ETSU CHEMICAL CO., LTD., Tokyo (JP)

(72) Inventors: Takenori Watabe, Annaka (JP); Hiroshi Hashigami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/271,478

(22) PCT Filed: Jun. 13, 2019

(86) PCT No.: PCT/JP2019/023396
§ 371 (c)(1),
(2) Date: Feb. 25, 2021

(87) PCT Pub. No.: WO2020/044730
PCT Pub. Date: Mar. 5, 2020

(65) Prior Publication Data
US 2021/0310119 A1    Oct. 7, 2021

(30) Foreign Application Priority Data
Aug. 27, 2018 (JP) .................. 2018-158078

(51) Int. Cl.
*C23C 16/448*    (2006.01)
*C23C 16/40*     (2006.01)
*C23C 16/455*    (2006.01)

(52) U.S. Cl.
CPC ........... *C23C 16/448* (2013.01); *C23C 16/40* (2013.01); *C23C 16/45561* (2013.01); *C23C 16/455* (2013.01)

(58) Field of Classification Search
CPC ... C23C 16/20; C23C 16/448; C23C 16/4486; C23C 16/455
(Continued)

(56) References Cited

U.S. PATENT DOCUMENTS 5,372,754 A * 12/1994 Ono .................. B01F 23/12
                                              261/142
5,383,970 A *  1/1995 Asaba ................ C23C 16/18
                                              118/715
(Continued)

FOREIGN PATENT DOCUMENTS

CN    1842492 A    10/2006
CN    1958623 A *  5/2007
(Continued)

OTHER PUBLICATIONS

Sep. 17, 2019 Search Report issued in Interntional Patent Application No. PCT/JP2019/023396.
(Continued)

*Primary Examiner* — Brian K Talbot
(74) *Attorney, Agent, or Firm* — Oliff PLC

(57) ABSTRACT

A film forming method for forming a film by heating a mist in a film-forming unit, the method including steps of: atomizing a raw-material solution in an atomizer to generate a mist; conveying the mist with a carrier gas from the atomizer to the film-forming unit through a conveyor that connects the atomizer and the film-forming unit; and heating the mist to form a film on a substrate in the film-forming unit. In this method, a flow rate of the carrier gas and a temperature of the carrier gas are controlled to satisfy $7<T+Q<67$, where Q represents the flow rate (L/minute) of the carrier gas, and T represents the temperature (° C.) of the carrier gas. Thus, provided is a film forming method excellent in film forming speed.

8 Claims, 2 Drawing Sheets

(58) Field of Classification Search
USPC .......................... 427/255.28; 239/136, 569
See application file for complete search history.

(56) References Cited

U.S. PATENT DOCUMENTS

| | | | | |
|---|---|---|---|---|
| 5,395,482 | A * | 3/1995 | Onda | C30B 33/00 438/743 |
| 5,776,254 | A | 7/1998 | Yuuki et al. | |
| 6,110,531 | A * | 8/2000 | Paz de Araujo | H01L 21/02274 438/785 |
| 6,155,540 | A * | 12/2000 | Takamatsu | C23C 16/4481 261/78.2 |
| 6,244,575 | B1 * | 6/2001 | Vaartstra | C23C 16/4486 118/708 |
| 6,821,341 | B2 * | 11/2004 | Vaartstra | C23C 16/40 117/89 |
| 8,012,876 | B2 * | 9/2011 | Oosterlaken | C23C 16/4481 438/680 |
| 10,017,856 | B1 * | 7/2018 | Arnepalli | H01L 21/02186 |
| 2001/0020448 | A1 | 9/2001 | Vaartstra et al. | |
| 2002/0020767 | A1 | 2/2002 | Pyo | |
| 2002/0073925 | A1 | 6/2002 | Noble et al. | |
| 2003/0116091 | A1 * | 6/2003 | Grant | C23C 16/4486 427/248.1 |
| 2004/0127070 | A1 * | 7/2004 | Teff | C08K 5/13 438/787 |
| 2005/0223987 | A1 | 10/2005 | Iwata et al. | |
| 2007/0154629 | A1 | 7/2007 | Fujita | |
| 2007/0163502 | A1 | 7/2007 | Nozawa et al. | |
| 2015/0225843 | A1 * | 8/2015 | Oda | C30B 29/16 427/255.28 |
| 2016/0060788 | A1 * | 3/2016 | Oda | C23C 16/18 257/769 |
| 2016/0222511 | A1 * | 8/2016 | Sasaki | C23C 16/45508 |
| 2017/0025644 | A1 * | 1/2017 | Nishi | C23C 24/082 |
| 2017/0200790 | A1 * | 7/2017 | Hitora | H01L 29/8725 |
| 2018/0066361 | A1 * | 3/2018 | Nara | C23C 16/448 |
| 2018/0152806 | A1 | 5/2018 | Zhang et al. | |
| 2018/0287169 | A1 * | 10/2018 | Yagyu | H01M 8/026 |
| 2018/0371613 | A1 * | 12/2018 | Nagaoka | C23C 16/4486 |
| 2019/0055646 | A1 * | 2/2019 | Oshima | C23C 16/45559 |
| 2019/0055667 | A1 * | 2/2019 | Oshima | H01L 21/02101 |
| 2019/0074178 | A1 * | 3/2019 | Jinno | C30B 29/16 |
| 2021/0013035 | A1 | 1/2021 | Fujita et al. | |
| 2022/0223406 | A1 | 7/2022 | Watabe et al. | |

FOREIGN PATENT DOCUMENTS

| | | |
|---|---|---|
| CN | 104736747 A | 6/2015 |
| CN | 105386008 A | 3/2016 |
| CN | 105986246 A | 10/2016 |
| CN | 106415845 A | 2/2017 |
| CN | 106573790 A | 4/2017 |
| CN | 113196458 A | 7/2021 |
| JP | H01-257337 A | 10/1989 |
| JP | 2005-307238 A | 11/2005 |
| JP | 2009-084626 A | 4/2009 |
| JP | 2010-003976 A | 1/2010 |
| JP | 2012-046772 A | 3/2012 |
| JP | 5397794 B1 | 1/2014 |
| JP | 2014-063973 A | 4/2014 |
| JP | 2014-234337 A | 12/2014 |
| JP | 2015-070248 A | 4/2015 |
| JP | 2015-134717 A | 7/2015 |
| JP | 2016-145388 A | 8/2016 |
| JP | 2016-146442 A | 8/2016 |
| JP | 2017-147231 A | 8/2017 |
| JP | 2018-070422 A | 5/2018 |
| JP | 2018-178229 A | 11/2018 |
| KR | 10-2008-0098813 A | 11/2008 |
| KR | 10-2016-0093510 A | 8/2016 |
| WO | 2005078781 A1 | 8/2005 |
| WO | 2016/133131 A1 | 8/2016 |
| WO | 2018/052097 A1 | 3/2018 |

OTHER PUBLICATIONS

Mar. 2, 2021 International Preliminary Report on Patentability issued in International Patent Application No. PCT/JP2019/023396.
May 12, 2022 Office Action issued in Indian Patent Application No. 202147007007.
Feb. 8, 2022 Office Action issued in Japanese Patent Application No. 2021-072637.
Jun. 13, 2022 Extended European Search Report issued in European Patent Application No. 19855762.1.
Aug. 18, 2022 Office Action issued in Chinese Patent Application No. 201980055286.4.
Oct. 4, 2022 Office Action issued in Taiwanese Patent Application No. 108130177.
Jul. 12, 2023 Office Action issued in U.S. Appl. No. 17/991,226.
Nov. 17, 2023 Office Action issued in U.S. Appl. No. 17/991,226.
Oct. 4, 2023 Hearing Notice issued in Indian Patent Application No. 202147007007.
Mar. 27, 2024 Office Action and Search Report issued in Chinese Application No. 201980055286.4.
May 13, 2024 Korean Office Action issued in Application No. 10-2021-7005700.

* cited by examiner

[FIG. 1]
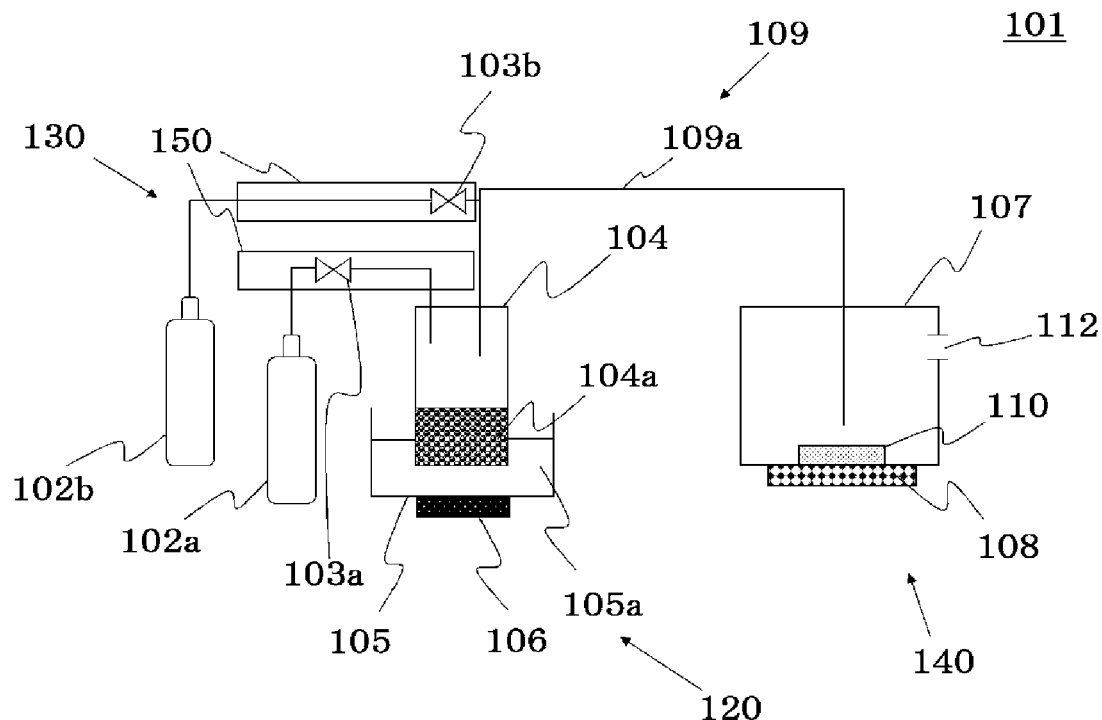
[FIG. 2]
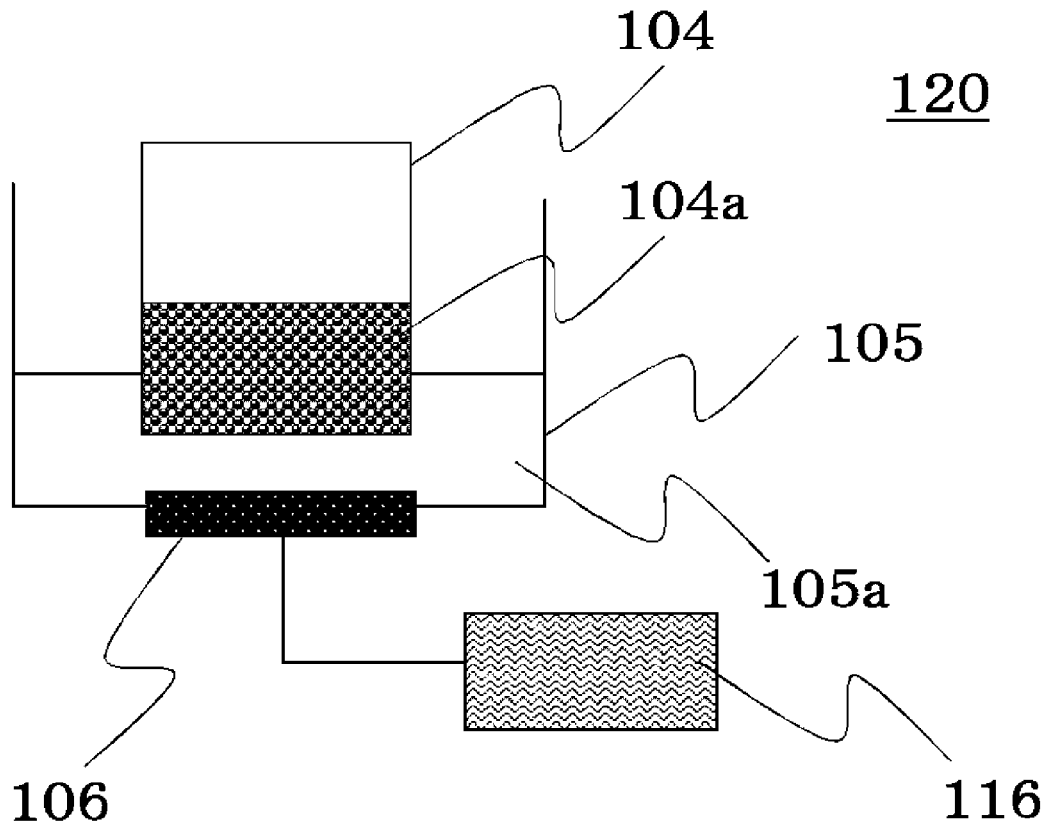

[FIG. 3]
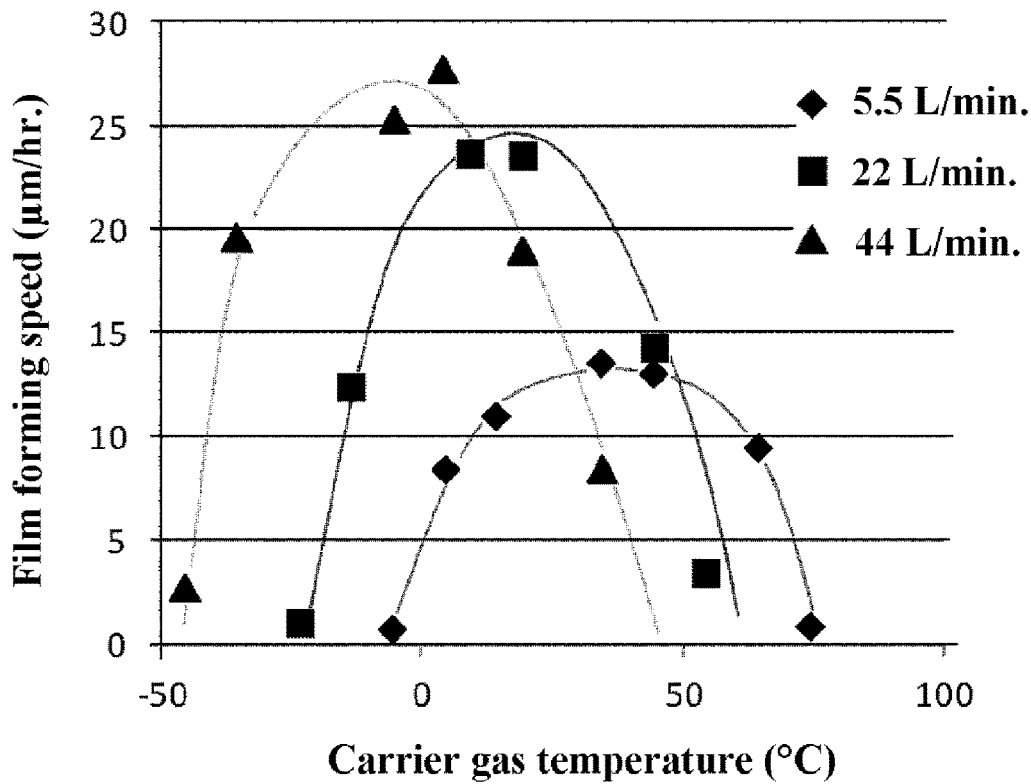
[FIG. 4]
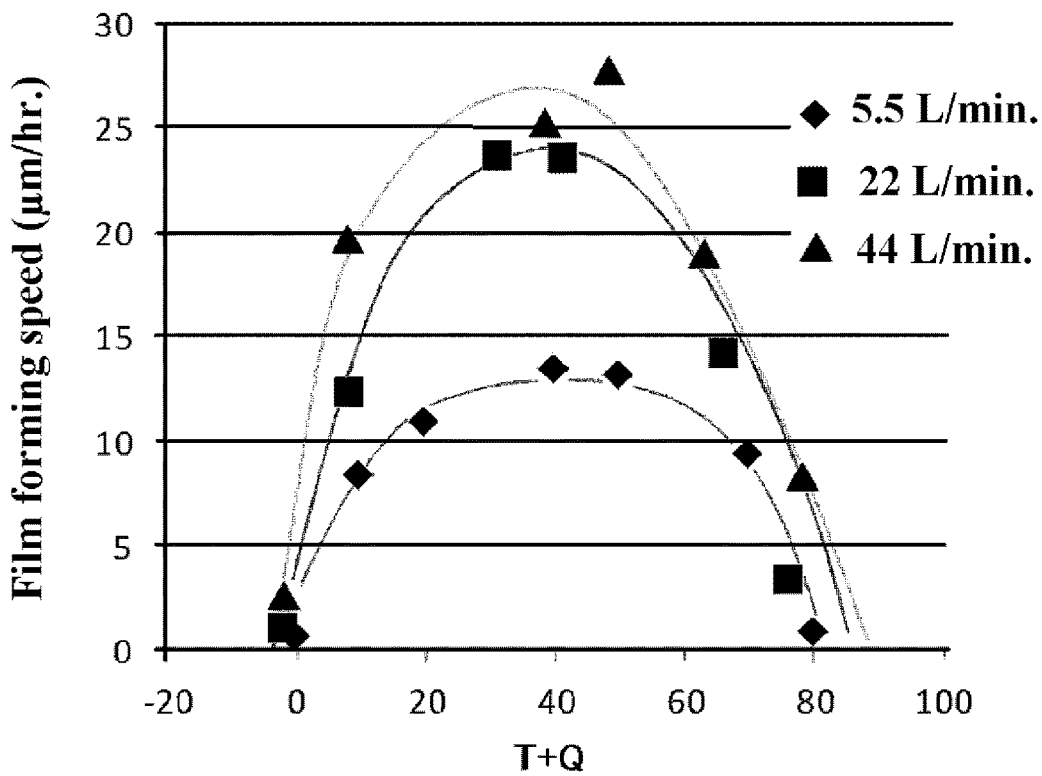

FILM FORMING METHOD

TECHNICAL FIELD

The present invention relates to a film forming method in which a film is formed on a substrate by using a raw material in a mist form.

BACKGROUND ART

Heretofore, there have been developed high-vacuum film forming apparatuses capable of achieving a non-equilibrium state in pulsed laser deposition (PLD), molecular beam epitaxy (MBE), sputtering, or other similar methods, and make it possible to manufacture oxide semiconductors, which have been impossible to manufacture by conventional melt method and so forth. In addition, Mist Chemical Vapor Deposition (Mist CVD. Hereinafter, this method may also be referred to as "mist CVD method") has been developed by which crystal is grown on a substrate using a raw material atomized into a mist form. This method enables production of corundum-structured gallium oxide ($\alpha$-$Ga_2O_3$). $\alpha$-$Ga_2O_3$ is expected to serve as a semiconductor having a large band gap, in the application to next-generation switching devices which can achieve high breakdown voltage, low loss, and high heat resistance.

In relation to mist CVD method, Patent Document 1 discloses a tubular furnace-type mist CVD apparatus. Patent Document 2 discloses a fine channel-type mist CVD apparatus. Patent Document 3 discloses a linear source-type mist CVD apparatus. Patent Document 4 discloses a tubular-furnace mist CVD apparatus, which is different from the mist CVD apparatus disclosed in Patent Document 1 in that a carrier gas is introduced into a mist generator. Patent Document 5 discloses a mist CVD apparatus in which a substrate is disposed above a mist generator and a susceptor is a rotary stage provided on a hot plate.

CITATION LIST

Patent Literature

Patent Document 1: JP H01-257337 A
Patent Document 2: JP 2005-307238 A
Patent Document 3: JP 2012-46772 A
Patent Document 4: JP 5397794 B
Patent Document 5: JP 2014-63973 A

SUMMARY OF INVENTION

Technical Problem

The mist CVD method does not require high temperature unlike the other CVD methods, but is capable of producing crystal structures in metastable phase, such as the corundum structure of $\alpha$-gallium oxide.

However, no particular consideration has been given so far to the influence from the temperature of carrier gases. Here, it has been found that when a carrier gas source is placed outdoors or in an indoor room without air conditioning, the carrier gas temperature varies, and influences the film forming speed to some extent.

Regarding this, the present inventors have found a new problem: while a generated mist is being conveyed to a substrate, the mist condenses to aggregate and form dew in a supply tube (the mist lifetime is shortened), and this mist in dew form is not transferred to a film-forming unit, so that the film forming speed is lowered. It has been found that the influence is particularly noticeable when the carrier-gas flow rate is low.

The present inventors have found another new problem: when a carrier gas is introduced into a supply pipe, the water-vapor partial pressure in the pipe is decreased; as a result, the mist disappears (evaporates), decreasing the mist amount that can contribute to film formation, and also decreasing the film forming speed. It has been found that the influence of this problem is particularly noticeable when the carrier-gas flow rate is high.

The present invention has been made to solve the above-described problems. An object of the present invention is to provide a film forming method excellent in film forming speed.

Solution to Problem

The present invention has been made to achieve the object, and provides a film forming method for forming a film by heating a mist in a film-forming unit, the method comprising steps of:

atomizing a raw-material solution in an atomizer to generate a mist;

conveying the mist with a carrier gas from the atomizer to the film-forming unit through a conveyor that connects the atomizer and the film-forming unit; and heating the mist to form a film on a substrate in the film-forming unit, wherein a flow rate of the carrier gas and a temperature of the carrier gas are controlled to satisfy $7<T+Q<67$, where Q represents the flow rate (L/minute) of the carrier gas, and T represents the temperature (° C.) of the carrier gas.

Such a film forming method makes it possible to greatly improve film forming speed by a simple process.

In this event, the film forming method may satisfy that the T+Q is $17<T+Q<57$.

Thereby, the film forming speed can be greatly improved more surely.

In this event, the film forming method may satisfy that the T+Q is $27<T+Q<47$.

Thereby, the film forming speed can be increased further reliably.

Advantageous Effects of Invention

As described above, the inventive film forming method enables great improvement in film forming speed by a simple process.

BRIEF DESCRIPTION OF DRAWINGS

FIG. 1 is a schematic configuration diagram showing an example of a film forming apparatus used in a film forming method according to the present invention.

FIG. 2 is a diagram for explaining an example of atomizer in the film forming apparatus.

FIG. 3 is a graph showing a relation of film forming speed to carrier gas temperature T.

FIG. 4 is a graph showing a relation of film forming speed to sum (T+Q) of carrier gas temperature T and carrier gas flow rate Q.

DESCRIPTION OF EMBODIMENTS

Hereinafter, the present invention will be described in detail, but the present invention is not limited thereto.

As noted above, there is a demand for a film forming method to greatly improve film forming speed in a mist CVD method.

The present inventors have earnestly studied the above-described problems, and consequently conceived the following film forming method for forming a film by heating a mist in a film-forming unit. The method includes steps of: atomizing a raw-material solution in an atomizer to generate a mist; conveying the mist with a carrier gas from the atomizer to the film-forming unit through a conveyor that connects the atomizer and the film-forming unit; and heating the mist to form a film on a substrate in the film-forming unit. Further, in the method, a flow rate of the carrier gas and a temperature of the carrier gas are controlled to satisfy $7<T+Q<67$, where Q represents the flow rate (Litter/minute) of the carrier gas, and T represents the temperature (° C.) of the carrier gas. This film forming method can easily suppress mist disappearance in the conveyor, increase the mist lifetime in the conveyor, and enhance the film forming speed. These findings have led to the completion of the present invention.

Hereinbelow, the description will be given with reference to the drawings.

Here, "mist" in the present invention is a general term of fine particles of a liquid dispersed in a gas, and also means what is called fog, droplet, etc.

FIG. 1 shows an example of a film forming apparatus 101 usable in the film forming method according to the present invention. The film forming apparatus 101 includes: an atomizer 120 configured to atomize a raw-material solution to generate a mist; a carrier-gas supplier 130 configured to supply a carrier gas by which a mist is conveyed; a film-forming unit 140 configured to heat a mist to form a film on a substrate; and a conveyor 109 configured to connect the atomizer 120 to the film-forming unit 140 and convey a mist by using a carrier gas. Moreover, the film forming apparatus 101 may include a controller (not shown) configured to control all or some parts of the film forming apparatus 101 so as to control the operation thereof.

(Atomizer)

In the atomizer 120, a raw-material solution 104a is prepared. The raw-material solution 104a is atomized to generate a mist. The atomization means is not particularly limited and may be known atomization means, as long as the raw-material solution 104a can be atomized. It is preferable to use atomization means utilizing ultrasonic vibration. This is because more reliable atomization is possible.

FIG. 2 shows an example of such atomizer 120. The atomizer 120 may include, for example, a mist generation source 104 where the raw-material solution 104a is housed; a container 105 where a medium, for example, water 105a, capable of transmitting ultrasonic vibration is put; and an ultrasonic transducer 106 attached to a bottom surface of the container 105. More specific configuration is as follows. The mist generation source 104 is a container for housing the raw-material solution 104a. By using a support (not shown), the mist generation source 104 is accommodated in the container 105, in which the water 105a is housed. The ultrasonic transducer 106 is provided at a bottom portion of the container 105. The ultrasonic transducer 106 is connected to an oscillator 116. Further, when the oscillator 116 is activated, the ultrasonic transducer 106 vibrates, and the ultrasonic wave propagates into the mist generation source 104 through the water 105a, so that the raw-material solution 104a is atomized.

(Film-Forming Unit)

Referring to FIG. 1 again, in the film-forming unit 140, a mist is heated to cause a thermal reaction to form a film on a portion or the entire surface of a substrate 110. The film-forming unit 140 may include, for example, a film forming chamber 107, in which the substrate 110 is disposed; and a hot plate 108 configured to heat the substrate 110. The hot plate 108 may be provided outside the film forming chamber 107 as shown in FIG. 1, or may be provided inside the film forming chamber 107. Moreover, the film forming chamber 107 is provided with an exhaust-gas discharge port 112 at such a position not to influence the mist supply to the substrate 110.

Note that, in the present invention, the substrate 110 may face downward, for example, by disposing it on a ceiling portion of the film forming chamber 107. Alternatively, the substrate 110 may face upward by disposing it on a bottom surface of the film forming chamber 107.

It is only necessary that the thermal reaction should cause a mist to undergo reaction by heating, and the reaction conditions etc. are not particularly limited. The conditions can be appropriately set according to the raw material and a film to be formed. For example, the heating temperature may be within a range from 120 to 600° C., preferably 200° C. to 600° C., more preferably 300° C. to 550° C.

The thermal reaction may be carried out under any atmosphere of vacuum, non-oxygen atmosphere, reducing gas atmosphere, air atmosphere, and oxygen atmosphere. The atmosphere can be appropriately set depending on a film to be formed. In addition, regarding the reaction pressure condition, the reaction may be performed under pressure, reduced pressure, or atmospheric pressure. A film is preferably formed under atmospheric pressure because this allows simplified apparatus configuration.

(Conveyor)

The conveyor 109 connects the atomizer 120 to the film-forming unit 140. Through the conveyor 109, a carrier gas conveys a mist from the mist generation source 104 of the atomizer 120 to the film forming chamber 107 of the film-forming unit 140. The conveyor 109 may be, for example, a supply tube 109a. As the supply tube 109a, for example, a quartz tube, a resin-made tube, etc. are usable.

(Raw-Material Solution)

The raw-material solution 104a is not particularly limited, as long as a material that can be atomized is contained. Such material may be an inorganic material or an organic material. A metal or a metal compound is suitably used. The raw-material solution 104a to be used may contain one or more kinds of metals selected from the gallium, iron, indium, aluminum, vanadium, titanium, chromium, rhodium, nickel, and cobalt.

The raw-material solution 104a is not particularly limited, as long as the metal(s) can be atomized. It is possible to suitably use the raw-material solution 104a in which the aforementioned metal(s) are dissolved or dispersed in a form of complex or salt in an organic solvent or water. Examples of the complex form include acetylacetonate complexes, carbonyl complexes, ammine complexes, hydrido complexes, etc. Examples of the salt form include metal chloride salts, metal bromide salts, metal iodide salts, etc. Moreover, solutions obtained by dissolving the metals in hydrobromic acid, hydrochloric acid, hydroiodic acid, or the like can be used as aqueous solutions of the salts.

Further, the raw-material solution 104a may be mixed with an additive, such as a hydrohalic acid or an oxidant. Examples of the hydrohalic acid include hydrobromic acid, hydrochloric acid, hydroiodic acid, etc. Among these, hydrobromic acid or hydroiodic acid is preferable. Examples of the oxidant include peroxides, such as hydrogen peroxide ($H_2O_2$), sodium peroxide ($Na_2O_2$), barium peroxide ($BaO_2$), and benzoyl peroxide ($(C_6H_5CO)_2O_2$); organic peroxides, such as hypochlorous acid (HClO), perchloric acid, nitric acid, ozone water, peracetic acid, and nitrobenzene; etc.

Further, the raw-material solution may contain a dopant. The dopant is not particularly limited. Examples thereof include n-type dopants, such as tin, germanium, silicon, titanium, zirconium, vanadium, and niobium; p-type dopants, such as copper, silver, tin, iridium, and rhodium; etc. The dopant concentration may be, for example, approximately $1\times10^{16}/cm^3$ to $1\times10^{22}/cm^3$, may be a low concentration of approximately $1\times10^{17}/cm^3$ or less, or may be a high concentration of approximately $1\times10^{20}/cm^3$ or more.

(Substrate)

The substrate 110 is not particularly limited, as long as it allows film formation thereon and can support the film. The material of the substrate 110 is not particularly limited, either, and known substrates can be used. The substrate 110 may be an organic compound or inorganic compound. Examples thereof include, but are not limited to, polysulfone, polyether sulfone, polyphenylene sulfide, polyether ether ketone, polyimide, polyether imide, fluorinated resin; metals, such as iron, aluminum, stainless steel, and gold; silicon, sapphire, quartz, glass, gallium oxide, etc. Regarding the shape, the substrate may be any shape. The present invention is effective for any shape. Examples of the shape include plate-like shapes such as flat plate and disk, fibrous, rod-like, columnar, prismatic, cylindrical, helical, spherical, annular shapes, etc. In the present invention, a plate-like substrate is preferable. The thickness of the plate-like substrate is not particularly limited, but is preferably 10 to 2000 µm, more preferably 50 to 800 µm. The plate-like substrate has an area of preferably 100 mm² or more; more preferably, the diameter is 2 inches (50 mm) or more.

(Carrier-Gas Supplier)

The carrier-gas supplier 130 may include a carrier gas source 102a configured to supply a carrier gas; and a flow-rate adjustment valve 103a configured to adjust a flow rate of a carrier gas (hereinafter referred to as "main carrier gas") sent out from the carrier gas source 102a. Moreover, as necessary, the carrier-gas supplier 130 can further include a diluent-carrier gas source 102b configured to supply a diluent carrier gas; and a flow-rate adjustment valve 103b configured to adjust a flow rate of a diluent carrier gas sent out from the diluent-carrier gas source 102b.

The type of the carrier gases is not particularly limited, and can be selected appropriately depending on a film to be formed. Examples of the carrier gases include oxygen, ozone; inert gases, such as nitrogen and argon; reducing gases, such as hydrogen gas and forming gas; etc. Additionally, regarding the type of the carrier gases, one type or two or more types may be used. For example, besides a first carrier gas, it is possible to additionally use a second carrier gas, such as a dilution gas that is prepared by diluting (for example, 10 fold dilution) a first carrier gas with another gas. Air can also be used.

Moreover, the number of positions where the carrier gas(es) are supplied is not limited to one, and may be two or more.

In the present invention, a flow rate Q of a carrier gas(es) refers to a total flow rate of the carrier gas(es). In the above example, a total of the flow rate of the main carrier gas sent out from the carrier gas source 102a and the flow rate of the diluent carrier gas sent out from the diluent-carrier gas source 102b is the flow rate Q of the carrier gases.

The carrier-gas flow rate Q is not particularly limited. For example, when a film is formed on a 30-mm square substrate, the flow rate Q is preferably 0.01 to 60 L/minute, more preferably 1 to 30 L/minute.

(Carrier-Gas Temperature Controller)

The film forming apparatus 101 includes a carrier-gas temperature controller 150 capable of adjusting a temperature T of a carrier gas(es). The method of controlling the temperature T of the carrier gas(es) is not particularly limited. Examples thereof include a method in which a pipe for temperature-adjusted water is installed around a pipe material for the carrier gas. Besides, the heating can be performed by a method in which a heating jacket is installed, a method in which the pipe material is heated with infrared radiation, or similar methods. Further, when the temperature is to be controlled to lower temperature, the cooling can be performed by routing the carrier gas pipe into a freezer. Alternatively, the pipe material may be cooled directly using a coolant, such as liquid nitrogen or fluorocarbon, or indirectly through the pipe etc. When the carrier gas sources 102a, 102b are structured as containers, the temperature of the containers themselves may be controlled by the methods as described above, or the temperature of a room where the containers are disposed may be controlled so as to control the carrier-gas temperature T.

As shown in FIG. 1, the carrier-gas temperature T is preferably controlled by the carrier-gas supplier 130 and then the carrier gas(es) are supplied to the conveyor 109 because of convenience. Nonetheless, if the carrier-gas temperature T can be controlled quickly, the carrier gas temperature may be controlled at a connection portion between the carrier-gas supplier 130 and the conveyor 109, and/or a connection portion between the carrier-gas supplier 130 and the atomizer 120.

The present invention is characterized by employing parameters of the carrier-gas temperature T and the carrier-gas flow rate Q, controlling each T and Q, and forming a film while T+Q satisfies a certain range. T+Q will be described later.

(Film Forming Method)

Next, an example of the film forming method according to the present invention will be described below with reference to FIG. 1.

First, the raw-material solution 104a is housed in the mist generation source 104 of the atomizer 120. The substrate 110 is disposed on the hot plate 108 directly or with a wall of the film forming chamber 107 interposed therebetween, and the hot plate 108 is activated.

Moreover, carrier gases are heated or cooled in the carrier-gas temperature controller 150 to control the temperature T of the carrier gases.

Next, the flow-rate adjustment valves 103a, 103b are opened to supply the carrier gases originated from the carrier gas sources 102a, 102b into the film forming chamber 107. The atmosphere of the film forming chamber 107 is sufficiently replaced with the carrier gases, and the flow rate of the main carrier gas and the flow rate of the diluent carrier gas are each adjusted to control the carrier-gas flow rate Q.

In a step of generating a mist, the ultrasonic transducer 106 is vibrated, and this vibration is propagated to the raw-material solution 104a through the water 105a. Thereby, the raw-material solution 104a is atomized and a mist is generated. Next, in a step of conveying the mist with the carrier gases, the mist is conveyed from the atomizer 120 via the conveyor 109 to the film-forming unit 140 by the carrier gases, and introduced into the film forming chamber 107. In a step of forming a film, the mist introduced in the film forming chamber 107 is heated for the thermal reaction in the film forming chamber 107 by heat of the hot plate 108, so that a film is formed on the substrate 110.

In this respect, the present inventors have focused on the carrier-gas flow rate Q and the carrier-gas temperature T to investigate the film forming speed. The results are described now.

FIG. 3 shows the results of investigating a relation among the carrier-gas flow rate Q (L/minute), the carrier-gas temperature T (° C.), and the film forming speed (μm/hour) when the above-described film forming method is employed. The vertical axis represents the film forming speed, and the horizontal axis represents the carrier-gas temperature T. The plots are distinctive for each carrier-gas flow rate Q.

Looking at the carrier-gas flow rate Q=5.5 L/min., the film forming speed is at its maximum when the carrier-gas temperature T is around 40° C.; meanwhile, when the carrier-gas temperature T is in ranges of approximately 0° C. or less and approximately 60° C. or more, the film forming speed sharply declines. Similarly, in a case of the carrier-gas flow rate Q=22 L/min., the film forming speed is at its maximum when the carrier-gas temperature T is around 20° C.; meanwhile, when the carrier-gas temperature T is in ranges of approximately −15° C. or less and approximately 45° C. or more, the film forming speed sharply declines. In a case of the carrier-gas flow rate Q=44 L/min., the film forming speed is at its maximum when the carrier-gas temperature T is around −5° C.; meanwhile, when the carrier-gas temperature T is in ranges of approximately −35° C. or less and approximately 25° C. or more, the film forming speed sharply declines.

These have revealed that the optimum temperature range of the carrier gases varies depending on the carrier-gas flow rate Q.

Nevertheless, when the parameters are arranged by adopting a relation between film forming speed and T+Q, where T represents carrier gas temperature (° C.) and Q represents carrier gas flow rate (L/min.), it has been surprisingly revealed that the film forming speed reaches the maximum when T+Q is around 40, regardless of the carrier-gas flow rate Q or the carrier-gas temperature T alone; meanwhile, when T+Q is in ranges of 7 or less and 67 or more, the film forming speed sharply declines (FIG. 4). In other words, it has been found that high film-forming speed is achieved reliably, no matter what values of T and Q are chosen, as long as a relation of $7<T+Q<67$ is satisfied, where T represents carrier-gas temperature (° C.) and Q represents carrier-gas flow rate (L/min.).

As described above, in the present invention, $7<T+Q<67$ is fulfilled, where T represents carrier-gas temperature (° C.) and Q represents carrier-gas flow rate (L/minute). Controlling the carrier-gas temperature T and the carrier-gas flow rate Q in this manner makes it possible to suppress the condensation and evaporation of a mist in the conveyor 109 and improve the film forming speed. The range of T+Q is preferably $17<T+Q<57$. This more surely allows great improvement of the film forming speed. The range is more preferably $27<T+Q<47$, so that further reliable improvement of the film forming speed is possible.

If $7 \geq T+Q$, that is, if $7-Q \geq T$, the water vapor in the pipe of the conveyor 109 becomes supersaturated, and the supersaturated water vapor aggregates with a mist serving as nuclei. Thereby, the mist is presumably enlarged, and the fall speed is increased, so that a large amount of the mist falls and turns into dew in the pipe; in addition, the amount of the mist transferred to the film-forming unit is decreased, and consequently the film forming speed is lowered.

Meanwhile, if $T+Q\geq 67$, that is, if $T\geq 67-Q$, the saturation water vapor pressure in the pipe of the conveyor 109 is increased. The mist evaporates so that the pipe can be saturated with the water vapor. In this case also, the amount of the mist transferred to the film-forming unit is presumably decreased, and consequently the film forming speed is lowered. Although the total amount of water transferred to the film-forming unit is the same, the mist that can contribute to film formation is decreased.

Note that the carrier gas temperature T is a temperature of a carrier gas(es) in the conveyor 109. To suppress the decrease of the mist amount in the conveyor 109, it is desirable to satisfy the relation of $7<T+Q<67$ in the entire area of the conveyor 109.

As the carrier-gas temperature T, it is preferable to directly measure the carrier gas temperature(s) at the connection portion between the carrier-gas supplier 130 and the conveyor 109, and/or the connection portion between the carrier-gas supplier 130 and the atomizer 120. Alternatively, in the steady state, the temperature(s) can be measured at a corresponding position(s) on the outer wall of the pipe.

Depending on the length of the conveyor 109 or the environment where the conveyor 109 is disposed, a change in the carrier gas temperature is negligible in some cases, and it is not always necessary to adjust the temperature of the conveyor 109. Nevertheless, it is preferable to provide the conveyor 109 with temperature-adjustment means to control the temperature because more reliable control of T+Q is possible. Furthermore, it is also preferable to measure the temperature at a connection portion between the conveyor 109 and the film-forming unit 140 to control the carrier-gas temperature T. In this way, T+Q can be controlled more reliably.

Note that, as long as the relation of $7<T+Q<67$ is satisfied, it is not always necessary to keep the carrier-gas temperature T constant across the entire area in the conveyor. For example, since $7<T+Q<67$ can be converted to $7-Q<T<67-Q$, the carrier-gas temperature T may vary within a range that corresponds to the predetermined carrier-gas flow rate Q.

EXAMPLE

Hereinafter, the present invention will be described in detail by showing Examples. However, the present invention is not limited thereto.

Example 1

Based on the above-described film forming method, a corundum-structured gallium oxide (α-Ga2O3) film was formed.

Specifically, first, an aqueous solution containing 0.1 mol/L of gallium bromide was prepared, and further mixed with a solution of 48% hydrobromic acid such that the volume ratio of the latter solution was 10%. The resultant served as the raw-material solution **104*a***.

The raw-material solution **104*a* obtained as described above was housed in the mist generation source 104. The temperature of the solution was 25° C. at this point. Next, as the substrate 110, a 4-inch (diameter: 100 mm) c-plane sapphire substrate was disposed in the film forming chamber 107 and abutted on the hot plate 108. The hot plate 108** was activated to increase the temperature to 500° C.

Subsequently, the flow-rate adjustment valves 103a, 103b were opened to supply oxygen gas as carrier gases from the carrier gas sources 102a, 102b into the film forming chamber 107. The atmosphere of the film forming chamber 107 was sufficiently replaced with the carrier gases, and the flow rate of the main carrier gas and the flow rate of the diluent carrier gas were respectively adjusted to 5 L/minute and 0.5 L/minute. This means the carrier-gas flow rate Q=5.5 L/minute.

The adjustment of the carrier-gas temperature T was possible with a pipe for temperature-controlled water, which was installed as the carrier-gas temperature controller 150 around the carrier-gas supply pipes.

In Example 1, the carrier-gas temperature T was set to 45° C. Thus, T+Q=50.5.

Next, the ultrasonic transducer 106 was vibrated at 2.4 MHz. The vibration was propagated to the raw-material solution 104a through the water 105a, so that the raw-material solution 104a was atomized to generate a mist. This mist was introduced into the film forming chamber 107 via the supply tube 109a by the carrier gases. Then, under conditions of atmospheric pressure and 500° C., the mist was subjected to thermal reaction in the film forming chamber 107. Thus, a thin film of corundum-structured gallium oxide ($\alpha$-Ga2O3) was formed on the substrate 110. The film-formation time was 30 minutes.

The growth speed was evaluated as follows. First, the thickness of the thin film on the substrate 110 was measured with a step gauge by setting 17 measurement points within the plane of the substrate 110. From the film thickness values, an average value was calculated to obtain an average film thickness. The obtained average film thickness was divided by the film-formation time. The resulting value was regarded as the film forming speed.

Comparative Example 1

A film was formed and evaluated under the same conditions as in Example 1, except that the carrier-gas temperature T was 74° C.; thus, T+Q=79.5.

Example 2

A film was formed and evaluated under the same conditions as in Example 1, except that the flow rate of the main carrier gas and the flow rate of the diluent carrier gas were respectively adjusted to 20 L/minute and 2 L/minute to set the carrier-gas flow rate Q=22 L/minute, and the carrier-gas temperature T was 10° C.; thus, T+Q=32.

Comparative Example 2

A film was formed and evaluated under the same conditions as in Example 2, except that the carrier-gas temperature T was 55° C.; thus, T+Q=77.

Example 3

A film was formed and evaluated under the same conditions as in Example 1, except that the flow rate of the main carrier gas and the flow rate of the diluent carrier gas were respectively adjusted to 40 L/minute and 4 L/minute to set the carrier-gas flow rate Q=44 L/minute, and the carrier-gas temperature T was 20° C.; thus, T+Q=64.

Comparative Example 3

A film was formed and evaluated under the same conditions as in Example 3, except that the carrier-gas temperature T was 35° C.; thus, T+Q=79.

Table 1 shows the conditions in Examples 1 to 3 and Comparative Examples 1 to 3, and the results of the film forming speed evaluation.

TABLE 1

|  | Q (L/min.) | T (° C.) | Q + T | Film forming speed (μm/hr.) |
| --- | --- | --- | --- | --- |
| Example 1 | 5.5 | 45 | 50.5 | 13.5 |
| Comparative Example 1 | 5.5 | 74 | 79.5 | 1.0 |
| Example 2 | 22 | 10 | 32 | 23.0 |
| Comparative Example 2 | 22 | 55 | 77 | 2.8 |
| Example 3 | 44 | 20 | 64 | 19.4 |
| Comparative Example 3 | 44 | 35 | 79 | 8.0 |

As apparent from the comparisons between Example 1 and Comparative Example 1, between Example 2 and Comparative Example 2, and between Example 3 and Comparative Example 3 in each pair of which the carrier-gas flow rates were the same, it can be seen that the film forming speeds greatly differ between the cases of satisfying and not satisfying 7<T+Q<67. Further, as long as 7<T+Q<67 was satisfied, high film forming speeds were achieved regardless of values of T and Q.

This consequently has enabled great improvement in film forming speed by a simple process.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A mist CVD film forming method for forming a film by heating a mist in a film-forming unit, the method comprising steps of:
    atomizing a raw-material solution in an atomizer to generate a mist;
    conveying the mist with a carrier gas from the atomizer to inside of the film-forming unit while maintaining a mist state through a conveyor that connects the atomizer and the film-forming unit; and
    heating the mist conveyed to the inside of the film-forming unit while maintaining the mist state to form a film on a substrate in the film-forming unit,
    wherein a flow rate of the carrier gas in the mist CVD film forming method and a temperature of the carrier gas in the mist CVD film forming method are controlled to satisfy 7<T+Q<67, where Q represents the flow rate (L/minute) of the carrier gas, and T represents the temperature (° C.) of the carrier gas.

2. The mist CVD film forming method according to claim 1, wherein the T+Q is 17<T+Q<57.

3. The mist CVD film forming method according to claim 1, wherein the T+Q is 27<T+Q<47.

4. The mist CVD film forming method according to claim 2, wherein the T+Q is 27<T+Q<47.

5. A method for manufacturing a mist CVD film formed substrate for forming a film on a substrate by heating a mist in a film-forming unit, the method comprising steps of:
    atomizing a raw-material solution in an atomizer to generate a mist;

conveying the mist with a carrier gas from the atomizer to inside of the film-forming unit while maintaining a mist state through a conveyor that connects the atomizer and the film-forming unit; and heating the mist conveyed to the inside of the film-forming unit while maintaining the mist state to form a film on a substrate in the film-forming unit, wherein a flow rate Q of the carrier gas in forming the mist CVD film formed substrate and a temperature T of the carrier gas in forming the mist CVD film formed substrate are controlled to satisfy $7<T+Q<67$, where Q represents the flow rate (L/minute) of the carrier gas, and T represents the temperature (° C.) of the carrier gas, and the temperature of heating the mist is 120 to 600° C.

6. The method for manufacturing a mist CVD film formed substrate according to claim 5, wherein the temperature T of the carrier gases are controlled by controlling the temperature of a room where the containers of the carrier gases are disposed.

7. The method for manufacturing a mist CVD film formed substrate according to claim 5, wherein the raw-material solution is a solution in which one or more metals selected from gallium, iron, indium, aluminum, vanadium, titanium, chromium, rhodium, nickel and cobalt are dissolved in hydrobromic acid, hydrochloric acid or hydroiodic acid.

8. The method for manufacturing a mist CVD film formed substrate according to claim 5, wherein the flow rate of the carrier gas Q is 0.01 to 60 L/min.

* * * * *